United States Patent

Yasuda et al.

[11] Patent Number: 6,060,403
[45] Date of Patent: May 9, 2000

[54] METHOD OF MANUFACTURING SEMICONDUCTOR DEVICE

[75] Inventors: Naoki Yasuda, Piscataway, N.J.; Masahiro Koike, Yokohama, Japan; Kouichi Muraoka, Sagamihara, Japan; Hideki Satake, Chigasaki, Japan

[73] Assignee: Kabushiki Kaisha Toshiba, Kawasaki, Japan

[21] Appl. No.: 09/154,042

[22] Filed: Sep. 16, 1998

[30] Foreign Application Priority Data

Sep. 17, 1997 [JP] Japan ................................ 9-252351
Jan. 8, 1998 [JP] Japan ................................ 10-002408

[51] Int. Cl.[7] .................................................. H01L 21/31
[52] U.S. Cl. .................. 438/765; 438/769; 438/775; 438/786; 438/791
[58] Field of Search ................................ 438/765, 769, 438/775, 786, 791

[56] References Cited

U.S. PATENT DOCUMENTS 3,373,051  3/1968  Chu et al. .
3,421,936  1/1969  Vogel .
4,435,447  3/1984  Ito et al. .
5,731,235  3/1998  Srinivasan et al. .
5,891,789  4/1999  Lee .

FOREIGN PATENT DOCUMENTS 4-72626  3/1992  Japan .
8-191067  7/1996  Japan .

Primary Examiner—John F. Niebling
Assistant Examiner—Josetta Jones
Attorney, Agent, or Firm—Finnegan, Henderson, Farabow, Garrett & Dunner, L.L.P.

[57] ABSTRACT

A method of manufacturing a semiconductor device comprises the step of applying a nitridation treatment to a semiconductor substrate in the presence of a network terminal element so as to form a nitride film containing the network terminal element on the semiconductor substrate.

20 Claims, 10 Drawing Sheets

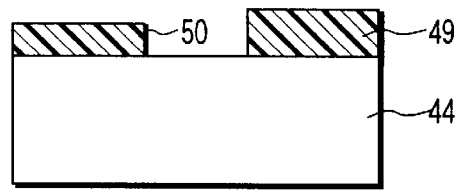
FIG. 14A
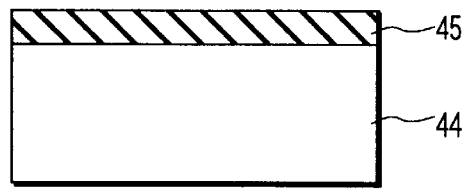
FIG. 15A
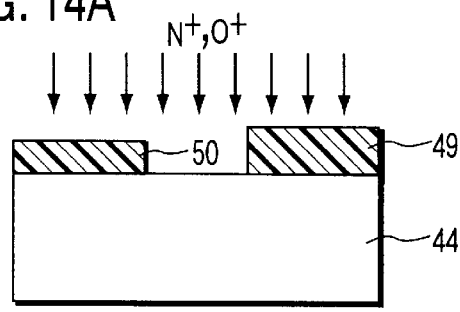
FIG. 14B
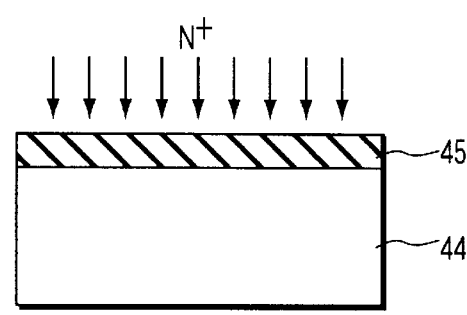
FIG. 15B
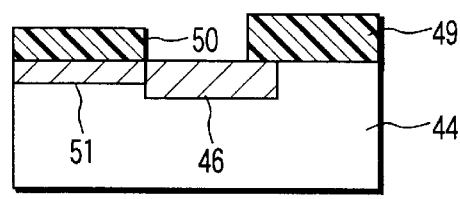
FIG. 14C
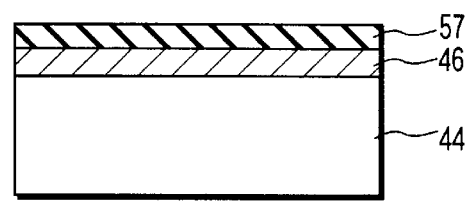
FIG. 15C
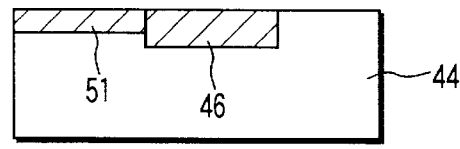
FIG. 14D
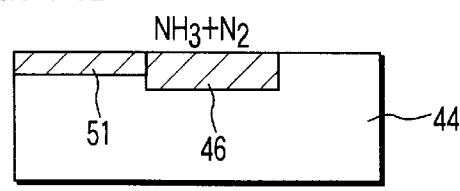
FIG. 14E
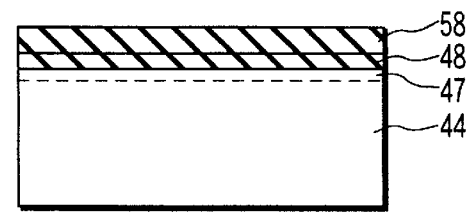
FIG. 15D
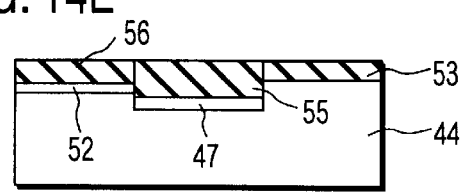
FIG. 14F
FIG. 15E

METHOD OF MANUFACTURING SEMICONDUCTOR DEVICE

BACKGROUND OF THE INVENTION

The present invention relates to a method of manufacturing a semiconductor device, particularly, to a method of manufacturing a semiconductor device having an MIS structure.

In accordance with miniaturization of a silicon semiconductor integrated circuit, an MIS (Metal Insulator Semiconductor) type semiconductor device is being made finer and finer. In recent years, the minimum size of the MIS type semiconductor device is approaching 0.1 $\mu$m. In the semiconductor device sized at about 0.1 $\mu$m, the gate oxide film is required to have a thickness of 2.5 nm in order to allow the device to maintain a satisfactory performance.

However, if the gate oxide film has a thickness smaller than 4 nm, a leak current through the gate oxide film is rapidly increased by a direct tunnel mechanism. The increased leak current lowers the reliability of the MIS type semiconductor device and increases the power consumption. These difficulties are unavoidable as far as a silicon oxide film is used as a gate insulating film.

In order to avoid these difficulties, vigorous studies are being made in an attempt to use a material having a dielectric constant higher than that of silicon oxide for forming the gate insulating film. Particularly, silicon nitride, which is highly compatible with the conventional silicon process, is expected to provide the most hopeful material for forming a gate insulating film in near future.

The method of forming a silicon nitride film includes mainly a thermal nitridation process in which a silicon substrate is nitrided under an ammonia atmosphere and a CVD (Chemical Vapor Deposition) process in which a nitride film is deposited on a silicon substrate. The former process (thermal nitridation process) makes it possible to form a nitride film small in trapping and low in interfacial energy level. However, the nitride film thickness is saturated at about 3 nm. On the other hand, the latter method (CVD method) certainly permits forming a nitride film of a sufficiently large thickness. However, it is difficult to obtain a high quality silicon nitride film.

As pointed out above, it is impossible to obtain a silicon nitride film having a sufficiently large thickness and a high film quality by any of the thermal nitridation process of a silicon substrate surface and the CVD method.

BRIEF SUMMARY OF THE INVENTION

An object of the present invention is to provide a method of manufacturing a semiconductor device comprising a silicon nitride film of a high quality and a sufficiently large thickness.

According to the present invention, there is provided a method of manufacturing a semiconductor device, comprising the step of forming a nitride film containing a network terminal element on a semiconductor substrate by nitriding the semiconductor substrate in the presence of the network terminal element.

According to the present invention, there is further provided a method of manufacturing a semiconductor device, comprising the steps of forming an amorphous silicon layer on a silicon substrate; and forming a thermally grown nitride film or a thermally grown oxynitride film by subjecting the substrate having the amorphous silicon layer formed thereon to a thermal nitridation treatment or a thermal oxynitridation treatment.

According to the present invention, there is further provided a method of manufacturing a semiconductor device, comprising the step of subjecting a surface region of a silicon substrate having a plane orientation having an atomic surface density higher than that of (100) plane orientation to a thermal nitridation or thermal oxynitridation treatment.

According to the present invention, there is further provided a method of manufacturing a semiconductor device, comprising the steps of forming a thermally grown silicon nitride film or thermally grown silicon oxynitride film on a surface of a first substrate, forming a thermally grown silicon nitride film or thermally grown silicon oxynitride film on a surface of a second substrate, and bonding the thermally grown silicon nitride film or thermally grown silicon oxynitride film formed on the first substrate to the thermally grown silicon nitride film or thermally grown silicon oxynitride film formed on the second substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIGS. 14A to 14F are cross sectional views showing another example of the manufacturing process according to the second method of the present invention;

FIGS. 15A to 15E are cross sectional views showing another example of the manufacturing process according to the second method of the present invention;

DETAILED DESCRIPTION OF THE INVENTION

First Method of the Invention

Figure 1:
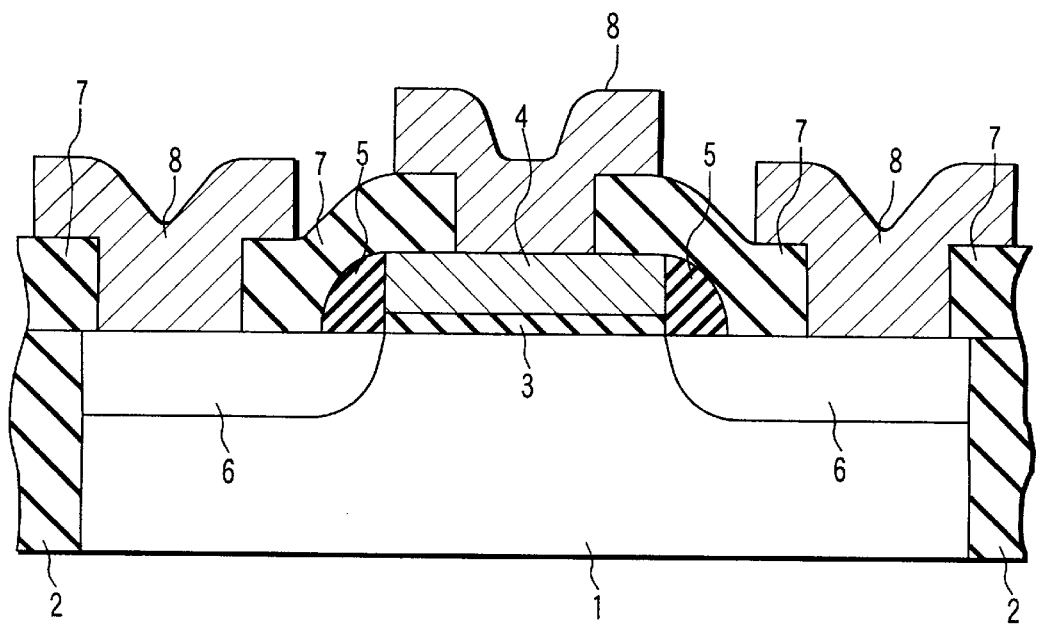
FIG. 1 is a cross sectional view showing an MIS transistor manufactured by a first method of the present invention.

The semiconductor device manufactured by the process according to a first method of the present invention comprises a nitride film. In the first method, the nitride film is formed by directly nitriding a semiconductor substrate surface with a gaseous material containing at least nitrogen. To be more specific, the nitriding method includes a thermal nitriding technique using a gaseous material containing at least nitrogen. Alternatively, the nitride film can be formed by a radical nitriding technique using a gaseous material containing at least radicals of nitrogen (typically, plasma nitride owing to nitrogen radical formed by plasma).

In the present invention, the network of a nitride film is terminated. Specifically, a network terminal element is allowed to act directly on the unbonded species of the nitride film network so as to terminate the nitride film network. Alternatively, the unbonded species formed by cutting a part of the nitride film network is terminated. The latter terminating process involving the cutting of the nitride film network is particularly important in the first method of the present invention.

It is desirable to use a halogen element and deuterium as the network terminal element. Particularly, it is desirable to use fluorine among halogen elements because Si—F bond is more stable than Si—Cl bond, etc.

The semiconductor substrate used in the present invention includes, for example, a Si substrate, a SiC substrate and a GaAs substrate. Particularly, it is desirable to use a Si substrate in view of the compatibility with the known semiconductor process technology. It follows that the nitride film formed by the first method of the present invention includes, particularly, a silicon nitride film.

The concentration of the network terminal element contained in the nitride film should desirably fall within a range of between $10^{11}$ atoms/cm$^2$ and $10^{15}$ atoms/cm$^2$. Where the network terminal element introduced onto the surface of the semiconductor substrate is taken into a nitride film, it is possible for the network terminal element to be present in every reaction site of the nitriding reaction if the concentration of the network terminal element is at least $10^{11}$ atoms/cm$^2$. As a result, termination of the network structure of the nitride film is promoted. Also, if the concentration of the network terminal element is not higher than $10^{15}$ atoms/cm$^2$, which is about a mono-layer or less, the nitriding reaction itself of the semiconductor substrate is not subject to a marked change.

In order to achieve nitriding of a semiconductor substrate in the presence of a network terminal element, it is possible to employ, for example, the method of nitriding a semiconductor substrate containing a network terminal element. It is also possible to form on a semiconductor substrate a nitride film containing a network terminal element, followed by nitriding the semiconductor element. Further, it is possible to achieve nitriding of a semiconductor substrate by supplying simultaneously or alternately a gaseous material containing nitrogen and another gaseous material containing a network terminal element onto a semiconductor substrate.

The thickness of the nitride film is saturated in the thermal nitriding, etc. of a silicon substrate. It should be noted in this connection that a silicon nitride film has a density higher than that of a silicon oxide film. In other words, the clearance of a silicon nitride network is smaller than that of a silicon dioxide network, with the result that substances are unlikely to be diffused through the silicon nitride network. Of course, impurities are unlikely to be diffused through the clearance of the silicon nitride network. In addition, formation of the silicon nitride film itself is impaired by the small clearance of the silicon nitride network. To be more specific, once a silicon nitride film is formed on a surface of a silicon substrate by, for example, a thermal nitridation, diffusion of the nitriding species into the silicon substrate is inhibited by the nitride film thus formed, making it impossible for the nitride film to grow further. This is why the thickness of the thermally grown nitride film, etc. is saturated at an early stage of the growth of the nitride film.

The present inventors have found that, in order to increase the saturation thickness of the nitride film obtained by a direct nitridation treatment of a semiconductor substrate such as a silicon substrate, it is effective to enlarge the clearance of the network of the nitride film. It has been found that the clearance of the network can be enlarged by substituting a network terminal element such as a halogen element in a part of the network of the nitride film. If the clearance of the network is enlarged, diffusion of the nitriding species is facilitated in the nitriding reaction step such as a thermal nitridation step, making it possible to increase the saturation thickness of the nitride film.

The diffusion coefficient of the nitriding species is exponentially increased with reduction in the potential barrier formed by the clearance of the network. In other words, a slight increase in the clearance of the network of the nitride film brings about a prominent increase in the saturation thickness of the nitride film.

It should also be noted that, if the clearance of the network of the nitride film is increased by introduction of a network terminal element into the network, the diffusion rate of the nitriding species is increased. It follows that a nitride film of a desired thickness can be obtained in a shorter time than in the past, leading to an improved through-put in the manufacture of a semiconductor device.

What should also be noted is that, by introducing appropriately a network terminal element into a nitride film, the trapping or interface states is expected to be terminated, e.g., Si—F bond, leading to an improved electrical characteristics of the nitride film.

As described above, a part of the network of a nitride film is terminated by a halogen element, etc. in the first method of the present invention so as to enlarge the clearance of the network of the nitride film and, thus, to facilitate the diffusion of the nitriding species. Therefore, it is possible to increase the saturation thickness of the nitride film obtained by the direct nitriding of the semiconductor substrate. Since the nitride film thus obtained exhibits excellent electrical characteristics and has a sufficient thickness, the nitride film is highly effective when used as a gate insulating film of a semiconductor device.

The process of manufacturing a semiconductor device by the first method of the present invention comprises the step of introducing into a semiconductor substrate a network terminal element for terminating the unbonded species generated by cutting a part of the network of a nitride film, and the step of nitriding the semiconductor substrate having the network terminal element introduced thereinto.

For introducing the network terminal element into the semiconductor substrate, it is possible to employ, for example, an ion implantation method. In this case, it is desirable to form a film for adjusting the peak of concentration of the network terminal element introduced in the semiconductor substrate on the semiconductor substrate prior to the ion implantation step. It is possible to use a nitride film or an oxide film formed by, for example, LPCVD method as the adjusting film of the peak of the concentration of the network terminal element. The peak adjusting film is peeled off after the ion implantation step with, for example, a dilute HF solution.

The network terminal element may also be introduced into the semiconductor substrate by, for example, a solid phase diffusion. To be more specific, a film containing the network terminal element is formed first on the semiconductor substrate, followed by annealing the semiconductor substrate having the film containing the network terminal element formed thereon. By the annealing treatment, the network terminal element is introduced into the semiconductor substrate. It should be noted that the film containing the network terminal element is peeled off before the thermal nitriding step with, for example, a buffered hydrofluoric acid.

In the first method of the present invention, it is desirable to carry out a pre-treating step for removing a native oxide film formed on the semiconductor substrate prior to the nitriding step. For example, it is desirable to carry out a thermal nitridation treatment using ammonia after the pre-treating step. In this case, it is desirable to carry out consecutively the pre-treating step and the thermal nitridation step.

It is also possible to introduce the network terminal element into the semiconductor substrate by forming on the semiconductor substrate a nitride film containing the network terminal element. To be more specific, the nitride film is formed by utilizing a nitriding reaction or, alternatively, by a deposition method.

It is typical to form the nitride film by nitriding a surface region of the semiconductor substrate. For nitriding the semiconductor substrate, a thermal nitridation treatment can be employed. Then, a network terminal element is introduced into the resultant nitride film, followed by an additional thermal nitridation treatment. The introduction of the network terminal element and the nitridation step prior to the introduction of the network terminal element may be carried out repeatedly a plurality of times. Also, it is desirable to carry out these introduction of the network terminal element and nitridation treatment consecutively.

It is also possible to supply onto a semiconductor substrate a gaseous material containing nitrogen and another gaseous material containing a network terminal element simultaneously or alternately so as to allow the semiconductor substrate to be nitrided by the gaseous material containing nitrogen and, thus, to form a nitride film containing the network terminal element on the semiconductor substrate.

After formation of the nitride film containing the network terminal element on the semiconductor substrate, it may be possible to form a film acting as a gate electrode, e.g., a polycrystalline silicon film, on the nitride film. In this case, it is desirable to carry out consecutively the formation of the nitride film and the polycrystalline silicon film.

Further, it is possible to introduce the network terminal element before the nitridation treatment such that the element concentration in a certain region differs from that in another region on the surface of the semiconductor substrate. In this case, it is possible to form a nitride film having locally different thickness on the same semiconductor substrate by a single nitridation treatment, leading to simplification of the manufacturing process of the semiconductor device.

Let us describe more in detail the manufacturing process according to the first method of the present invention with reference to the accompanying drawings.

Specifically, FIG. 1 is a cross sectional view exemplifying an MIS transistor manufactured by the first method of the present invention. As shown in the drawing, an element isolating region 2 consisting of a silicon oxide film is formed in a predetermined region of a p-type silicon substrate 1. A transistor is formed within an element region surrounded by two adjacent element isolating regions 2. To be more specific, a source region 6 and a drain region 6 are formed apart from each other within the element region. A gate insulating film 3 is interposed between these source and drain regions 6. A gate electrode 4 consisting of a polycrystalline silicon is formed on the gate insulating film 3. Further, a side wall insulating film 5 is formed to cover the side edges of the gate insulating film 3 and the gate electrode 4. The resultant structure is covered with an interlayer insulating film 7 consisting of a silicon oxide film. Electrodes 8 are connected to the gate electrode 4 and the source-drain regions 6 through apertures made in the interlayer insulating film 7. The gate insulating film 3 consists of a silicon nitride film. It should be noted that the network terminal element is contained in the silicon nitride film forming the gate insulating film 3.

Figure 2:
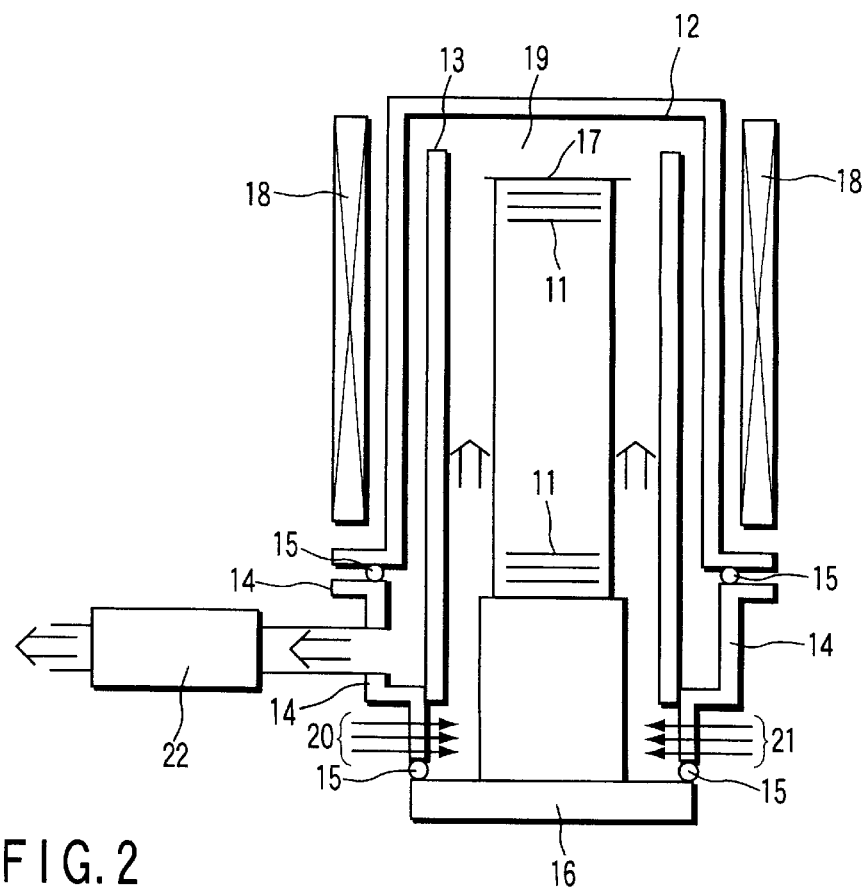
FIG. 2 schematically shows the construction of the apparatus used for manufacturing a semiconductor device according to the first method of the present invention.

FIG. 2 exemplifies an apparatus used for forming the gate insulating film 3 shown in FIG. 1. As shown in the drawing, the manufacturing apparatus comprises an outer tube 12 made of silicon dioxide or silicon carbide and an inner tube 13 arranged inside the outer tube 12 and made of silicon dioxide or silicon carbide. These outer and inner tubes 12 and 13 are supported by a supporting cylinder 14. These outer tube 12, inner tube 13 and supporting cylinder 14 are kept hermetic to each other by, for example, O-rings 15. Also, the bottom surface of the apparatus is kept hermetic by a flange 16 and the O-ring 15. A wafer boat 17 made of quartz and having semiconductor wafers 11 housed therein is arranged on the flange 16. A heater 18 for heating the apparatus is arranged outside the outer tube 12. Further, a nozzle 20 for introducing $NH_3$, $NF_3$ and $SiH_4$ into a process chamber 19 and another nozzle 21 for introducing $N_2$, Ar and $H_2$ into the process chamber 19 are connected to the supporting cylinder 14. Still further, an exhaust system for discharging the waste gas from within the process chamber 19 is connected to the supporting cylinder 14.

Let us describe some examples of forming the gate insulating film shown in FIG. 1 by using the apparatus shown in FIG. 2.

Figure 3A:
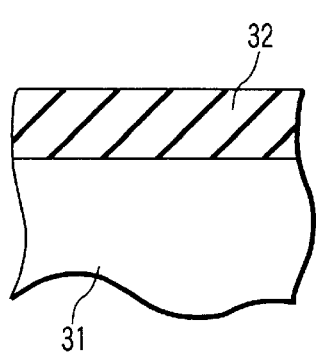
FIGS. 3A to 3D are cross sectional views showing an example of the manufacturing process according to the first method of the present invention.

Specifically, FIGS. 3A to 3D are cross sectional views showing the process of forming the gate insulating film consisting of a silicon nitride film containing a network terminal element. In the first step, a silicon wafer (or silicon substrate 31) which has been subjected to a washing treatment is put in the apparatus shown in FIG. 2. Then, a $SiH_4$ gas and an $NH_3$ gas are introduced into the process chamber for depositing a silicon nitride film 32 in a thickness of about 20 nm by an LPCVD method on a surface of the silicon substrate 31, as shown in FIG. 3A.

Figure 3B:
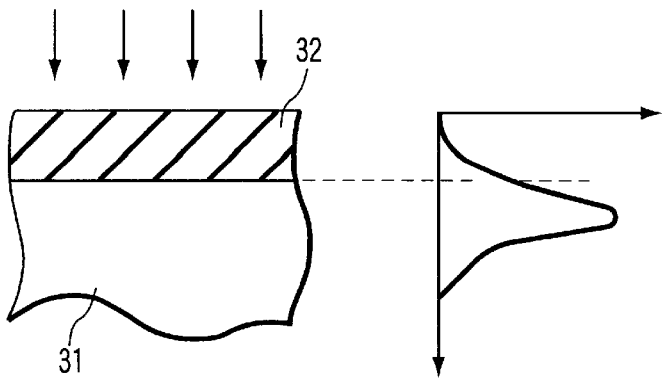

In the next step, the wafer is taken out of the apparatus, followed by introducing $F^+$ ions into the wafer by means of ion implantation under an accelerating energy of 20 KeV and a dose of $5 \times 10^{13}$ cm$^{-2}$. As shown in FIG. 3B, the implanted fluorine ions are distributed such that a peak of the fluorine ion concentration is formed inside the silicon substrate 31.

Figure 3C:
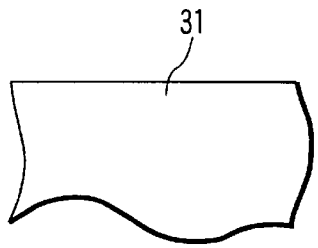
Figure 3D:
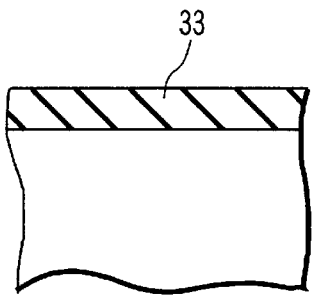

After the ion implantation step, the silicon nitride film 32 is removed with a dilute HF solution so as to expose the wafer surface to the outside as shown in FIG. 3C. Then, the wafer is brought back into the film-forming apparatus shown in FIG. 2. Further, an $NH_3$ gas is introduced into the process chamber so as to carry out a thermal nitridation treatment at 950° C. for 10 minutes so as to form a thermal silicon nitride film 33 having a thickness of 5 nm on the surface of the silicon substrate 31, as shown in FIG. 3D.

Figure 4A:
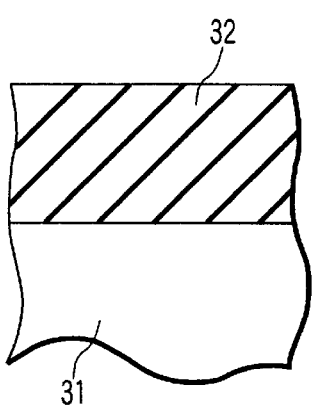
FIGS. 4A to 4D are cross sectional views showing another example of the manufacturing process according to the first method of the present invention.

FIGS. 4A to 4D are cross sectional views showing another example of forming a gate insulating film consisting of a silicon nitride film containing a network terminal element. In this case, a silicon substrate 31, which has been subjected to a washing treatment, is introduced into the apparatus shown in FIG. 2. Then, a $SiH_4$ gas and an $NH_3$ gas are introduced into the process chamber for depositing a silicon nitride film 32 in a thickness of about 50 nm by an LPCVD method, on a surface of the silicon substrate 31, as shown in FIG. 4A.

Figure 4B:
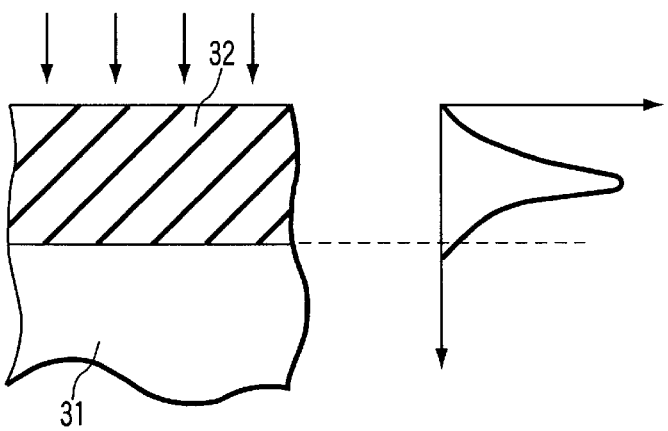

In the next step, the wafer is taken out of the apparatus, followed by introducing $F^+$ ions into the wafer by means of ion implantation under an accelerating energy of 20 KeV and a dose of $5 \times 10^{14}$ cm$^{-2}$. As shown in FIG. 4B, the implanted fluorine ions are distributed such that a peak of the fluorine ion concentration is formed inside the silicon nitride film 32. In this case, only traces of fluorine ions are implanted into the silicon substrate 31. Then, the fluorine atoms within the silicon nitride film 32 are diffused into the silicon substrate 31 (solid phase diffusion) by applying an annealing treatment at 900° C. for 30 minutes under an nitrogen gas atmosphere.

Figure 4C:
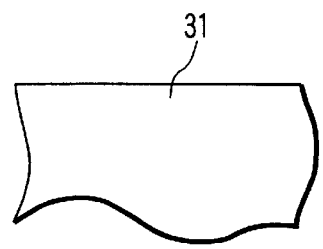
Figure 4D:
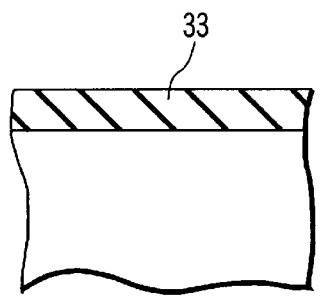

Subsequently, the silicon nitride film 32 is removed with a buffered hydrofluoric acid so as to expose the surface of the silicon substrate to the outside, as shown in FIG. 4C. Then, a thermal nitridation treatment is carried out within the apparatus shown in FIG. 2 at 950° C. for 10 minutes in the presence of an ammonia gas ($NH_3$) so as to form a thermally grown silicon nitride film 33 having a thickness of 5 nm on the surface of the silicon substrate 31, as shown in FIG. 4D.

Figure 5A:
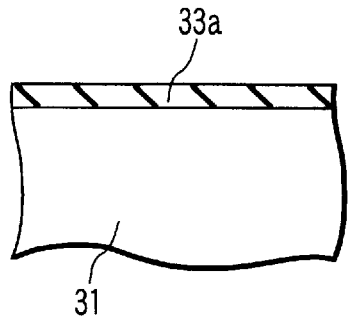
FIGS. 5A to 5C are cross sectional views showing another example of the manufacturing process according to the first method of the present invention.
Figure 5B:
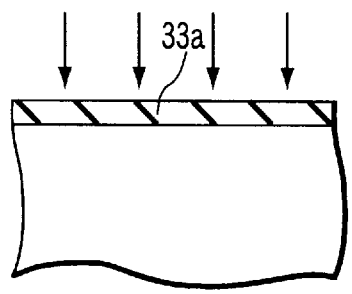
Figure 5C:
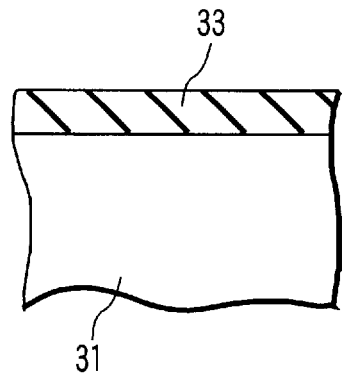

FIGS. 5A to 5C are cross sectional views showing another example of forming a gate insulating film consisting of a silicon nitride film containing a network terminal element.

In the first step, a silicon substrate 31, which as been subjected to a washing treatment, is housed in the apparatus shown in FIG. 2 so as to carry out a thermal nitridation treatment at 950° C. for 5 minutes in the presence of an ammonia gas ($NH_3$). As a result, formed is a silicon nitride film 33a having a thickness of 2 nm on a surface of the silicon substrate 31, as shown in FIG. 5A.

Then, the wafer is taken out of the apparatus, and $F^+$ is introduced by an ion implantation method under an accelerating energy of 0.5 KeV and a dose of $5 \times 10^{13}$ cm$^{-2}$. In this case, the implanted fluorine ions are distributed such that a peak of concentration of the implanted fluorine ions is formed within the thermally grown nitride film 33a.

The silicon substrate having the thermally grown nitride film 33a formed thereon is further subjected to a thermal nitridation treatment at 950° C. for 5 minutes within the apparatus shown in FIG. 2. Then, the atmosphere within the process chamber is replaced by a nitrogen gas ($N_2$) for applying an annealing treatment to the silicon substrate at 950° C. for 5 minutes so as to form a thermally grown silicon nitride film 33 having a thickness of 5 nm on the surface of the silicon substrate, as shown in FIG. 5C.

Incidentally, the same effect can be obtained in the case of consecutively carrying out the thermal nitridation treatment and the ion implantation within the same process chamber.

Figure 6A:
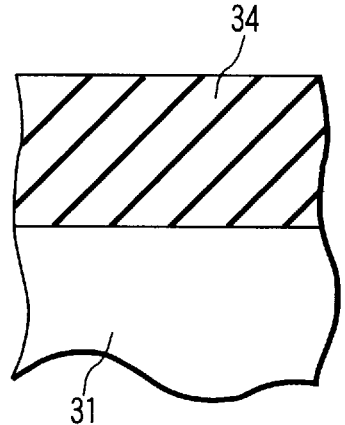
FIGS. 6A to 6C are cross sectional views showing another example of the manufacturing process according to the first method of the present invention.
Figure 6B:
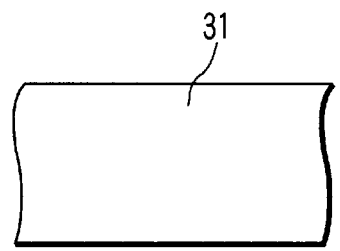
Figure 6C:
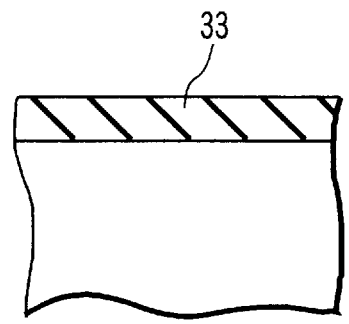

FIGS. 6A to 6C are cross sectional views showing another example of forming a gate insulating film consisting of a silicon nitride film containing a network terminal element.

In this case, a silicon substrate 31, which has been subjected to a washing treatment, is housed in a PECVD apparatus, and a fluorine-added $SiO_2$ 34 having a thickness of 100 nm is deposited on a surface of the silicon substrate 31 as shown in FIG. 6A by allowing a mixture of TEOS/$O_2$/$C_2F_6$ to flow into the PECVD apparatus.

In the next step, the wafer is housed in the apparatus shown in FIG. 2 so as to apply an annealing treatment to the wafer at 950° C. for 30 minutes under a nitrogen gas atmosphere so as to allow the fluorine atoms contained in the $SiO_2$ film 34 to be diffused into the silicon substrate 31. Then, the wafer is taken out of the apparatus, and the fluorine-added $SiO_2$ film 34 is peeled off with a dilute HF solution so as to expose the surface of the silicon substrate 31 to the outside, as shown in FIG. 6B.

After removal of the $SiO_2$ film 34, the wafer is brought back into the apparatus shown in FIG. 2 so as to apply a thermal nitridation treatment to the silicon substrate 31 by allowing an ammonia gas to flow within the process chamber. As a result, a thermally grown silicon nitride film 33 having a saturation thickness of 5 nm is formed on the surface of the silicon substrate 31, as shown in FIG. 6C.

FIGS. 7A to 7E are cross sectional views showing another example of forming a gate insulating film consisting of a silicon nitride film containing a network terminal element.

In this example, the step of introducing fluorine into a silicon substrate, the step of removing a native oxide film from the substrate surface, the thermal nitridation step, and the step of forming a polycrystalline silicon layer forming a gate electrode are carried out consecutively.

Figure 7A:
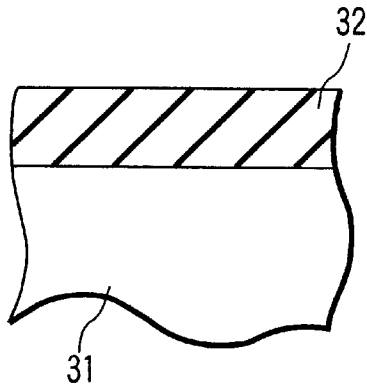
FIGS. 7A to 7E are cross sectional views showing another example of the manufacturing process according to the first method of the present invention.
Figure 7D:
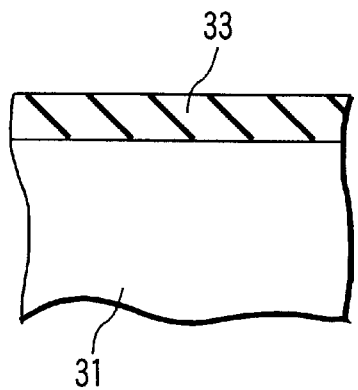
Figure 7B:
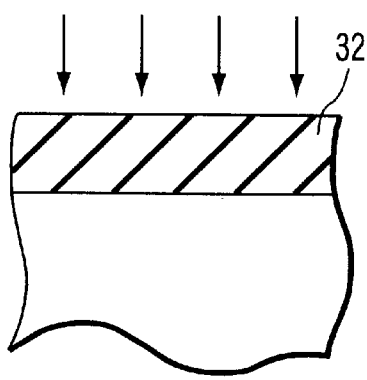

In the first step, a silicon nitride film 32 having a thickness of 20 nm is deposited by an LPCVD method on a surface of a silicon substrate 31, which has been subjected to a washing treatment in advance, as shown in FIG. 7A. Then, $F^+$ is introduced into the silicon nitride film 32 by means of ion implantation under an accelerating energy of 20 KeV and a dose of $5 \times 10^{13}$ cm$^{-2}$ as shown in FIG. 7B. The implanted fluorine ions are distributed such that a peak of the fluorine ion concentration is formed inside the silicon substrate 31.

Figure 7E:
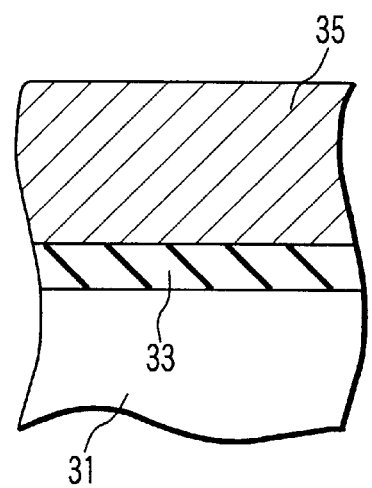
Figure 7C:
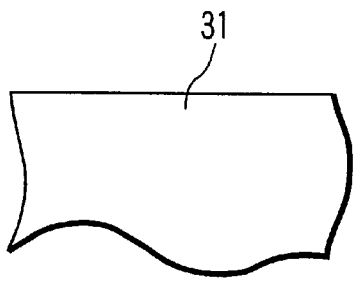

After the ion implantation step, the silicon nitride film 32 is peeled off with a dilute HF solution so as to expose a surface of the silicon substrate 31 to the outside, as shown in FIG. 7C, followed by washing the silicon substrate 31. The washing treatment can be carried out by dipping the wafer in a solution containing hydrochloric acid and hydrogen peroxide. Then, the wafer is housed in the apparatus shown in FIG. 2 so as to carry out consecutively the process steps described below within the same process chamber included in the apparatus shown in FIG. 2.

Specifically, a hydrogen gas is supplied into the process chamber at a temperature of 700° C. and a pressure of 10 Torr for 10 minutes so as to peel off the native oxide film absorbed to the wafer surface. The same effect can be obtained if the temperature is changed from 700° C. to 850° C. and the process chamber is maintained at a reduced pressure, i.e., $O_2$ and $H_2O$ partial pressure of $10^{-6}$ Torr or less, for 10 minutes. After removal of the native oxide film from the surface of the silicon substrate 31, an ammonia gas is introduced into the process chamber so as to carry out a thermal nitridation treatment under a temperature of 950° C. and a pressure of 20 Torr for 10 minutes. As a result, a thermally grown silicon nitride film 33 having a thickness of 5 nm is formed on the surface of the silicon substrate 31, as shown in FIG. 7D. After formation of the thermally grown silicon nitride film 33, a $SiH_4$ gas is supplied into the process chamber at a temperature of 600° C. and a pressure of 0.1 Torr so as to form a polycrystalline silicon film 35 having a thickness of 200 nm on the thermal silicon nitride film 33, as shown in FIG. 7E.

Figure 8A:
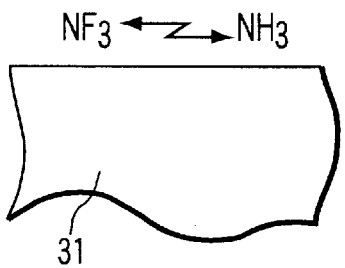
FIGS. 8A to 8C are cross sectional views showing another example of the manufacturing process according to the first method of the present invention.
Figure 8B:
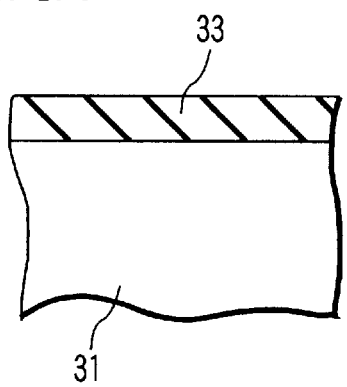
Figure 8C:
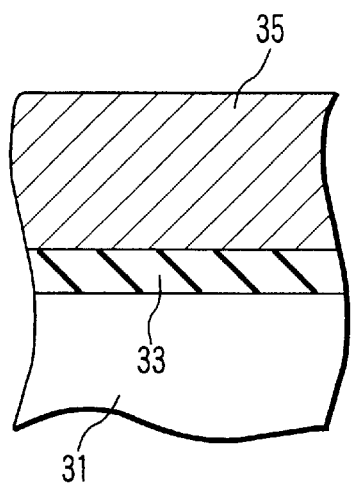

FIGS. 8A to 8C are cross sectional views showing another example of forming a gate insulating film consisting of a silicon nitride film containing a network terminal element.

In the first step, a silicon substrate 31, which has been subjected to a washing treatment, is housed in the process chamber included in the apparatus shown in FIG. 2. In this case, an $NF_3$ gas and an $NH_3$ gas are alternately supplied into the process chamber a plurality of times, as shown in FIG. 8A, so as to achieve growth of a thermally grown silicon nitride film while introducing fluorine into the thermally grown silicon nitride film. As a result, a thermally grown silicon nitride film 33 having a saturation film thickness of 5 nm on the surface of the silicon substrate 31, as shown in FIG. 8B.

Then, a polycrystalline silicon film 35 having a thickness of 200 nm is formed on the thermally grown silicon nitride film 33 as shown in FIG. 8C by supplying a $SiH_4$ gas into the process chamber as in the example described previously with reference to FIG. 7E. FIG. 8C shows the resultant structure.

Figure 9A:
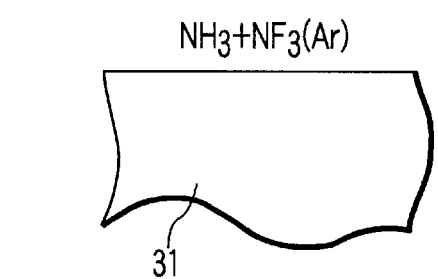
FIGS. 9A to 9C are cross sectional views showing still another example of the manufacturing process according to the first method of the present invention.
Figure 9B:
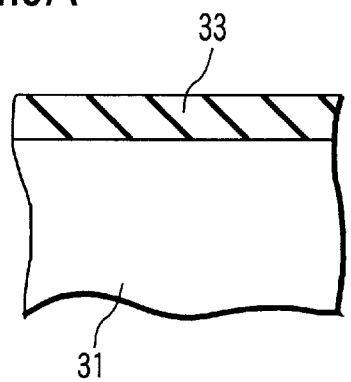
Figure 9C:
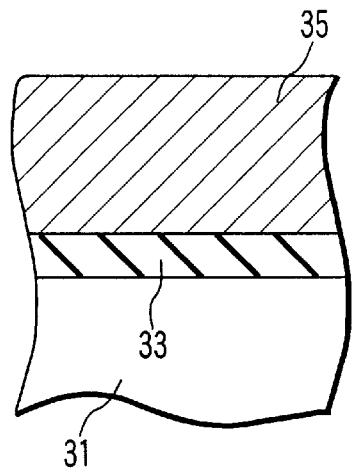

Further, FIGS. 9A to 9C are cross sectional views showing still another example of forming a gate insulating film consisting of a silicon nitride film containing a network terminal element.

In the first step, a silicon substrate 31, which has been subjected to a washing treatment, is housed in the process chamber included in the apparatus shown in FIG. 2. Then, a native oxide film is removed from the surface of the silicon substrate as in the example described previously with reference to FIGS. 7A to 7E. After removal of the native oxide film, an $NH_3$ gas and an $NF_3$ gas diluted sufficiently with an Ar gas are supplied into the process chamber, as shown in FIG. 9A. In this step, it is desirable to dilute the $NF_3$ gas sufficiently with an Ar gas in order to avoid a danger caused by a reaction between $NH_3$ and $NF_3$. A thermal nitridation treatment is carried while introducing fluorine into a thermally grown silicon nitride film in this fashion so as to form a thermally grown silicon nitride film 33 having a saturation thickness of 5 nm on the surface of the silicon substrate 31, as shown in FIG. 9B.

Then, a polycrystalline silicon film 35 having a thickness of 200 nm is formed by a consecutive step while introducing a $SiH_4$ gas into the process chamber, as in the example described previously with reference to FIGS. 7A to 7E. FIG. 9C shows the resultant structure.

Incidentally, where the technical idea of the present invention is applied to the manufacture of a semiconductor integrated circuit including, for example, a DRAM region and a LOGIC region, the amount of the fluorine introduction into the DRAM region is made different from that into the LOGIC region. As a result, thermally grown nitride films differing from each other in thickness and adapted for the individual purposes are formed in the DRAM region and the LOGIC region in the subsequent thermal nitridation step.

The first method of the present invention can be modified in various fashions. For example, it is possible to employ a thermal nitriding step utilizing the heating with a lamp, e.g., a thermal nitridation with ammonia, in the nitriding step. A thermally grown nitride film having a saturation thickness can be obtained in this case, too. It is also possible to subject a silicon substrate to a direct nitridation treatment utilizing radicals such as a plasma nitridation treatment.

Further, the nitridation treatment can be applied to a semiconductor wafer having a semiconductor layer formed thereon such as an SOI (Silicon on Insulator) substrate.

According to the first method of the present invention, an element for terminating a part of the network is introduced into a silicon nitride film so as to increase the clearance of the network of the nitride film and, thus, to facilitate diffusion of the nitriding species. As a result, a saturation thickness of a nitride film obtained by the direct nitridation treatment of a semiconductor substrate is increased, making it possible to obtain a sufficiently thick silicon nitride film having an excellent quality.

Second Method of the Invention

Let us describe the manufacturing process according to the second method of the present invention.

Specifically, the manufacturing process according to the second method of the present invention comprises the step of forming an amorphous silicon film on a silicon substrate and the step of subjecting the amorphous silicon layer to a thermal nitridation treatment or a thermal oxynitridation treatment.

As a result of an extensive research on an amorphous silicon, the present inventors have found that the amorphous silicon layer contains a large amount of interstitial silicon atoms and silicon dangling bonds. In other words, the amount of silicon atoms having a small bonding energy, which is contained in an amorphous silicon layer, is larger than that in a single crystalline silicon. Therefore, if a thermal nitridation treatment is applied to an amorphous silicon layer, a large amount of silicon atoms are readily migrated from the amorphous silicon layer into a thermally grown nitride film. In this fashion, diffusion of silicon atoms is increased.

Such being the situation, a thermally grown silicon nitride film having a saturation thickness larger than that in the conventional process of subjecting a single crystalline silicon substrate to a direct thermal nitridation treatment can be obtained in the case of subjecting an amorphous silicon layer to a thermal nitridation treatment. Also, in the case of subjecting an amorphous silicon layer to a thermal oxynitridation treatment, it is possible to obtain a thermally grown silicon oxynitride film in a time shorter than in the case of the conventional process of subjecting a single crystalline silicon substrate to a direct thermal oxynitridation treatment.

In the second method of the present invention, used is a substrate having a silicon region formed on at least a surface region. Specifically, it is possible to use a single crystalline silicon substrate or a semiconductor substrate having a single crystalline silicon layer formed thereon with an insulating film interposed therebetween. It is also possible to use a substrate having a nitride film, an oxynitride film or an oxide film formed in the silicon region of the substrate. In the case of using a substrate having a thermally grown silicon nitride film etc. formed in the silicon region, the thickness of the underlying thermally grown silicon nitride film is added to the thickness of the newly formed film, making it possible to obtain a thicker thermally grown nitride film.

The amorphous silicon layer can be formed on a silicon substrate by depositing the raw material of the amorphous silicon layer on the silicon substrate. It is possible to form a thermally grown nitride film or a thermally grown oxynitride film on the silicon substrate before deposition of the amorphous silicon layer.

Further, an amorphous silicon layer can be formed by introducing a predetermined element into a surface region of a silicon substrate by means of ion implantation so as to make the surface region amorphous. The elements which can be introduced into a surface region of a silicon substrate by means of ion implantation include, for example, nitrogen, silicon, hydrogen, heavy hydrogen, an inert gas element and oxygen. It is possible to introduce a plurality of these elements into the surface region by ion implantation. The effective dose is at least $1 \times 10^{13}$ cm$^{-2}$. Also, it is desirable to implant ions of these elements into a surface region of a silicon substrate in a direction perpendicular to the silicon region surface, though the implanting direction is not particularly limited in the present invention.

Where ions of an inert gas, e.g., Ar$^+$, are implanted into a surface region of the silicon substrate, an additional effect other than the effect of making the silicon layer amorphous can also be obtained. Specifically, since Ar is introduced into the clearance among the components of the thermally grown nitride film, the network of the film is moderated so as to increase the silicon diffusion. As a result, it is possible to obtain a sufficiently thick thermally grown nitride film.

In the case of introducing N$^+$ or Si$^+$ by ion implantation, these ions are taken into a thermally grown nitride film after formation of the thermally grown nitride film, making it possible to form a pure thermally grown nitride film consisting of only nitrogen atoms and silicon atoms.

Where a thermal nitridation treatment is applied to a silicon layer which has been made amorphous by ion implantation, it is possible to obtain a thermally grown silicon nitride film having a large saturation thickness. Also, where the amorphous silicon layer is subjected to a thermal oxynitridation treatment, a thermally grown silicon oxynitride film can be formed in a short time.

The ion implantation is applied to a silicon region formed on a surface of the substrate. Alternatively, the ion implantation can be applied to a nitride film, an oxynitride film or an oxide film formed on the silicon region of the substrate. In the latter case, it is possible to obtain an additional effect other than the effect of making the single crystalline silicon layer amorphous. Specifically, a large number of dangling bond can be formed within the nitride film, etc. by the ion implantation so as to facilitate the diffusion of silicon atoms.

The thermal nitridation treatment or the thermal oxynitridation treatment can be performed simultaneously with the ion implantation into a silicon surface region. In this case, it is possible to obtain a nitride film, etc. having a large number of dangling bond while converting the single crystalline silicon region into an amorphous silicon region. After ion implantation, it is preferable to carry out a thermal nitridation treatment etc. the amorphous region.

It is also possible to carry out the ion implantation at a low temperature by cooling the substrate. In this case, a large amorphous region can be formed, compared with the ion implantation carried out at room temperature, with the result that a thicker thermally grown nitride film can be formed.

Further, it is possible to form a mask in a predetermined region on a substrate prior to the ion implantation into the silicon substrate. In this case, the mask may be removed after the ion implantation step and before application of a thermal nitridation treatment or a thermal oxynitridation treatment. The mask can be formed of, for example, a CVD silicon nitride film, a CVD oxide film or a resist film.

The mask can be formed in a silicon region surface. Alternatively, the mask can be formed on a nitride film, an oxynitride film or an oxide film formed on the silicon region. Further, it is possible to form a plurality of different kinds of masks differing from each other in thickness.

Where an ion implantation is carried out after formation of a mask in a predetermined region of the silicon substrate, a thick amorphous layer is formed in an exposed region which is not covered with the mask. In the region covered with the mask, it is possible for the ion implantation into the silicon region to be inhibited by the mask. In this case, an amorphous layer is not formed. However, where ions are implanted into the silicon region through the mask, an amorphous layer is formed in a thickness smaller than in the exposed region. It follows that a thicker thermally grown nitride film or thermally grown oxynitride film can be formed in the exposed region than in the masked region by carrying out a thermal nitridation treatment or thermal oxynitridation treatment after the ion implantation step.

Also, in the case of using, for example, two kinds of masks differing from each other in thickness, it is possible to form three kinds of thermally grown nitride films, etc. differing from each other in thickness in the exposed region, and in the regions covered with the thin and thick masks. In this case, it is possible to implant at least oxygen ions, followed by applying a thermal nitridation treatment. Naturally, a thermally grown oxynitride film can be formed in the region where the oxygen ions have been implanted. It is possible to implant other ions together with the oxygen ions. Since a thermally grown nitride film is formed in the region where the oxygen ion implantation is inhibited by the mask, a plurality of different kinds of films can be formed by a simple process.

Further, it is possible to increase the thickness of the thermally grown nitride film, etc. formed in each region by deepening the amorphous region by applying an additional ion implantation treatment after removal of the mask.

As described above, a plurality of nitride films etc. differing from each other in thickness and kind can be formed by forming masks in predetermined regions of a silicon substrate. If the particular method is applied to the manufacture of a semiconductor device having an MIS structure, it is possible to obtain an MIS type semiconductor device having a plurality of gate insulating films differing from each other in thickness and kind by a simple process.

In the present invention, it is possible to use a silicon substrate having a plane orientation higher in the atomic surface density than the (100) plane orientation. A thermally grown nitride film or a thermally grown oxynitride film having a sufficient thickness can be formed by applying a thermal nitridation or thermal oxynitridation treatment to the surface region having the particular plane orientation.

It is impossible to form a thermally grown nitride film having a sufficient thickness on a substrate having a (100)

plane orientation, which is generally used in the manufacture of a semiconductor device. The present inventors have found that a diffusion source of silicon atoms can be increased by using a silicon wafer having a plane orientation higher in the atomic surface density than the (100) plane orientation. In other words, use of a silicon wafer having the particular plane orientation makes it possible to form a thermally grown silicon nitride film having a large saturation thickness or to form a thermally grown silicon oxynitride film in a short time, compared with the conventional process of applying a thermal nitridation treatment or a thermal oxynitridation treatment to a substrate having a (100) plane orientation by a conventional film-forming method.

The silicon substrate having a plane orientation higher in the atomic surface density than the (100) plane orientation represents the main plane orientations other than the (100) plane orientation, said main plane orientations having an atomic surface density higher than that of (100) plane orientation. Typically, the particular main plane orientations include (111), (112) and (113) plane orientations. In the present invention, it is also possible to use silicon substrates having plane orientations deviant by a predetermined angle from the predetermined main plane orientations, e.g., (111), (112) and (113) plane orientations, and having an atomic surface density higher than that of the predetermined main plane orientations and (100) plane orientation.

The present invention also provides a method of manufacturing a semiconductor device, which permits forming a thermally grown nitride film or a thermally grown oxynitride film having a large thickness, comprising the step of forming a thermally grown nitride film or a thermally grown oxynitride film on a surface of a first substrate, the step of forming a thermally grown nitride film or a thermally grown oxynitride film on a surface of a second substrate, and the step of bonding the thermally grown nitride film or thermally grown oxynitride film formed on the first substrate to the thermally grown nitride film or thermally grown oxynitride film formed on the second substrate. The particular method of the present invention covers the cases where the two thermally grown nitride films are bonded to each other, where two thermally grown oxynitride films are bonded to each other, where the thermally grown nitride film is bonded to the thermally grown oxynitride film, and where the thermally grown nitride film or the thermally grown oxynitride film is bonded to the thermal oxide film.

Let us describe more in detail the manufacturing process according to the second method of the present invention with reference to the accompanying drawings.

Figure 10A:
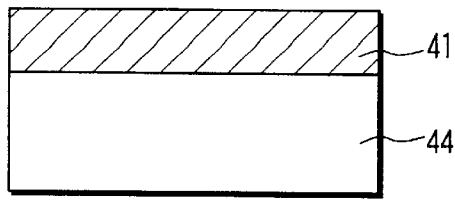
FIGS. 10A to 10D are cross sectional views showing an example of the manufacturing process according to a second method of the present invention.
Figure 10B:
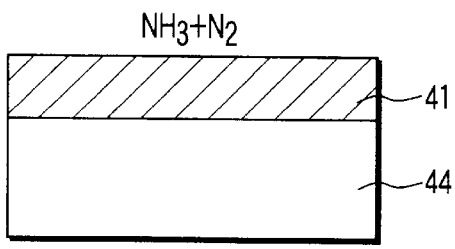

Specifically, FIGS. 10A to 10D are cross sectional views showing an example of the process according to the second method of the present invention. In the first step, an amorphous silicon layer 41 is deposited on an underlying substrate having at least a single crystalline silicon region 44 formed on a surface region, as shown in FIG. 10A. Then, an RTN (Rapid Thermal Nitridation) is carried out under a nitrogen gas atmosphere containing ammonia ($NH_3$), as shown in FIG. 10B. The annealing temperature is set at 900° C. and the annealing time is 20 seconds.

Figure 10C:
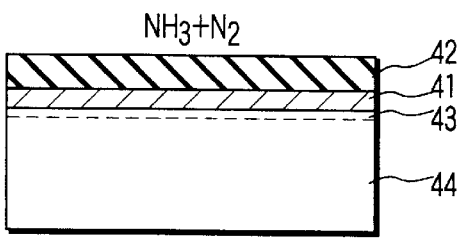

If the amorphous silicon layer 41 is subjected to the nitridation treatment, a front surface region of the amorphous silicon layer 41 is converted into a thermally grown nitride film 42, as shown in FIG. 10C. On the other hand, a back surface region of the amorphous silicon layer 41 is converted into a single crystalline silicon layer 43, the single crystallization proceeding from the interface between the amorphous silicon layer 41 and the silicon region 44.

Figure 10D:
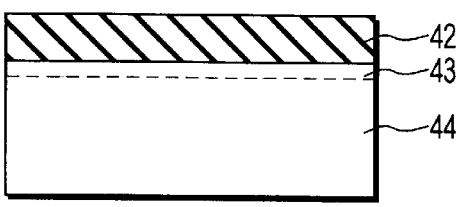

Finally, the amorphous silicon layer 41 is converted into any of the thermally grown nitride film 42 or the single crystalline silicon layer 43, as shown in FIG. 10D.

In this example, the interface states at the interface between the thermally grown nitride film 42 and single crystalline silicon layer 43 can be held at a low level.

It should be noted that the thermally grown nitride film 42 prepared by applying a thermal nitridation treatment to the amorphous silicon layer 41 has a thickness larger than that of a thermally grown nitride film formed by applying an RTN to a silicon substrate under the same temperature condition. Since a thermally grown nitride film of the same thickness can be obtained by setting the annealing temperature at a lower level, the process can be simplified. Further, since the annealing can be performed in a short time, it is expected to shorten further the process time.

Incidentally, the thermally grown nitride film 42 can be formed by using a gas other than an ammonia gas as far as the gas contains nitrogen. Also, a thermally grown oxynitride film can be formed in place of the thermally grown nitride film by applying a thermal oxynitridation treatment in place of the thermal nitridation treatment. In this case, the annealing treatment should be carried out under an $N_2O$ gas atmosphere at 1100° C. for 240 seconds.

FIGS. 11A to 11D are cross sectional views showing another example of the manufacturing process according to the second method of the present invention.

Figure 11A:
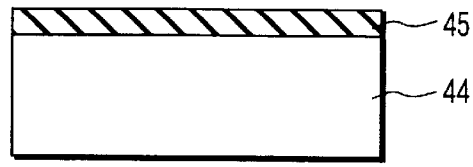
FIGS. 11A to 11D are cross sectional views showing another example of the manufacturing process according to the second method of the present invention.
Figure 11B:
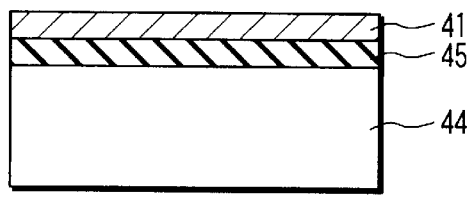
Figure 11C:
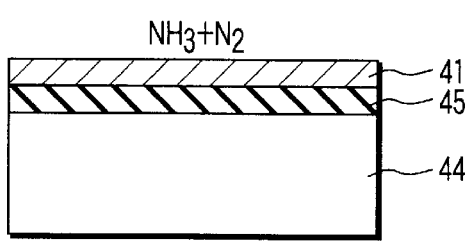
Figure 11D:
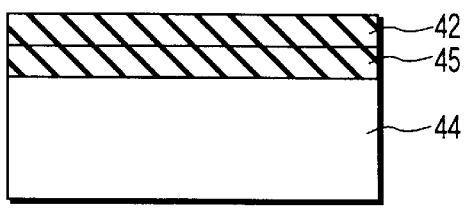

In the first step, an RTN is applied to a substrate having at least a silicon region 44 on a surface under a nitrogen gas atmosphere containing ammonia so as to form a thermally grown nitride film 45 on the surface of the silicon region 44, as shown in FIG. 11A. The annealing temperature is set at 1100° C. and the annealing time is 240 seconds. Then, an amorphous silicon film 41 is deposited on the surface of the thermally grown nitride film 45 as shown in FIG. 11B, followed by applying an RTN treatment to the amorphous silicon layer 41 under a nitrogen gas atmosphere containing ammonia at 1100° C. for 240 seconds, as shown in FIG. 11C. Finally, by applying an RTN to the amorphous silicon layer 41, this amorphous silicon layer 41 is converted into a thermally grown nitride film 42, as shown in FIG. 11D. In this case, the thermally grown nitride film 42 thus formed is continuous to the thermally grown nitride film 45 formed previously.

In this example, the interface states at the interface between the silicon region 44 and the nitride film 45 can be held at a low level. Also, the thermally grown nitride film 42 is formed on the thermally grown nitride film 45 having a thickness saturated at the annealing temperature of 1100° C., resulting in formation of a thermally grown nitride film having a large thickness.

FIGS. 12A to 12E are cross sectional views showing another example of the manufacturing process according to the second method of the present invention.

Figure 12A:
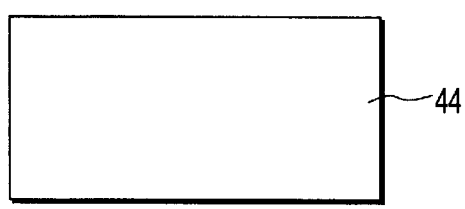
FIGS. 12A to 12E are cross sectional views showing another example of the manufacturing process according to the second method of the present invention.
Figure 12B:
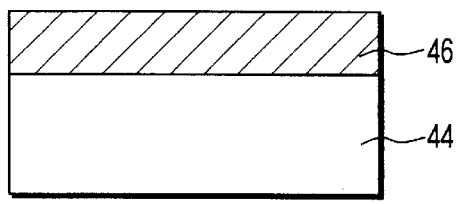

In the first step, nitrogen ions $N^+$ are implanted into a substrate having at least a silicon region 44 formed on a surface in a direction perpendicular to the surface of the silicon region 44, as shown in FIG. 12A. The ion implantation is performed at an accelerating energy of 10 KeV and a dose of $1 \times 10^{15}$ cm$^{-2}$. An amorphous layer 46 containing silicon as a main component is formed on the surface of the silicon region 44 as a result of the nitrogen ion implantation, as shown in FIG. 12B.

Figure 12C:
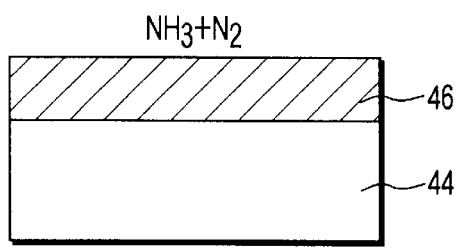
Figure 12D:
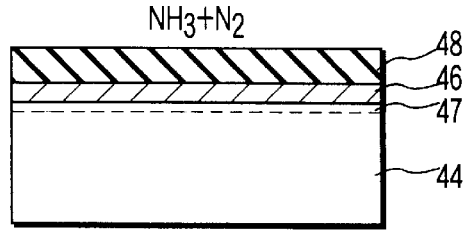
Figure 12E:
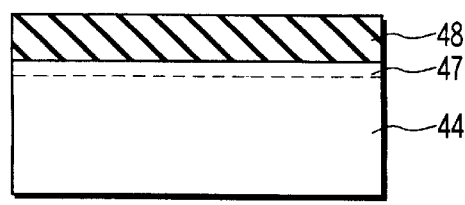

After formation of the amorphous layer 46, an RTN is applied to the amorphous layer 46 under a nitrogen gas atmosphere containing ammonia, as shown in FIG. 12C. The annealing temperature is set at 1100° C. and the annealing time is 240 seconds. If the amorphous layer 46 is subjected to a thermal nitridation treatment, a front surface region of the amorphous layer 46 is thermally nitrided so as to be converted into a thermally grown nitride film 48. On the other hand, a back surface region of the amorphous layer 46 is converted into a single crystalline silicon layer 47, the single crystallization proceeding from the interface between the amorphous layer 46 and the silicon region 44, as shown in FIG. 12D. Finally, the amorphous layer 46 is converted by the thermal nitridation treatment into a thermally grown nitride film 48 or a single crystalline silicon layer 47, as shown in FIG. 12E.

In the example described above, the interface states at the interface between the silicon layer 47 and the nitride film 48 is held at a low level, with the result that the film forming time can be shortened, compared with the conventional thermal nitridation treatment. It is also possible to form the thermally grown nitride film 48 having a thickness larger than that in the case of applying a thermal nitridation treatment to the silicon substrate.

FIGS. 13A to 13F are cross sectional views showing another example of the manufacturing process according to the second method of the present invention.

Figure 13A:
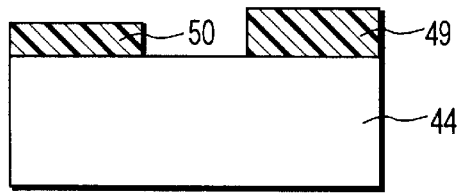
FIGS. 13A to 13F are cross sectional views showing another example of the manufacturing process according to the second method of the present invention.
Figure 13B:
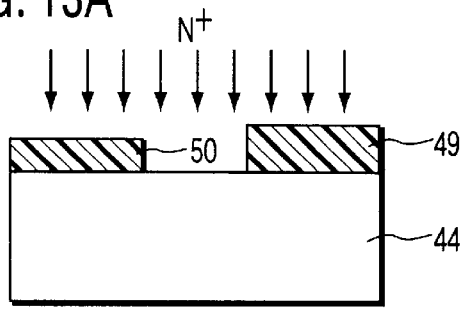

In the first step, a thick mask 49 and a thin mask 50 are formed in predetermined regions on a surface of a substrate having at least a silicon region 44 formed on the surface, as shown in FIG. 13A. Then, nitrogen ions N$^+$ are implanted into the silicon region 44 comprising covered region with the masks 49 and 50 in a direction perpendicular to the surface of the silicon region 44 as shown in FIG. 13B. The nitrogen ion implantation is carried out at an accelerating energy of 10 KeV and a dose of $1 \times 10^{15}$ cm$^{-2}$.

Figure 13C:
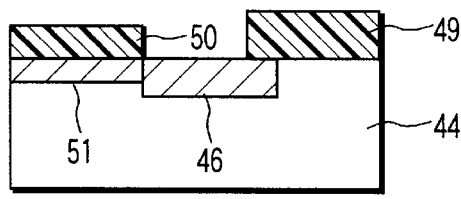

It should be noted that the implanted nitrogen ions do not reach that surface of the silicon region 44 which is covered with the thick mask 49, with the result that the particular surface of the silicon region 44 remains unchanged, as shown in FIG. 13C. On the other hand, an amorphous layer 46 is formed by the nitrogen ion implantation in the exposed region, which is not covered with any of the masks, of the silicon region 44. Also, a thin amorphous layer 51 is formed in that surface region of the silicon region 44 which is covered with the thin mask 50.

Figure 13D:
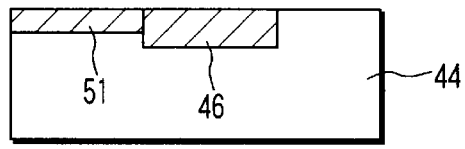
Figure 13E:
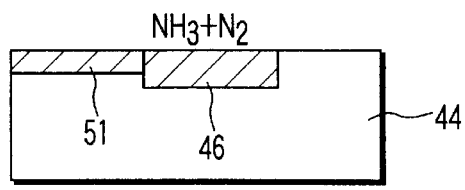

After the ion implantation step, the masks 49 and 50 are peeled off so as to expose the silicon surface region to the outside, as shown in FIG. 13D. Then, an RTN is applied to the substrate surface region having the amorphous layers 46 and 51 formed therein under a nitrogen gas atmosphere containing ammonia, as shown in FIG. 13E. The annealing temperature is set at 1100° C. and the annealing time is 240 seconds.

Figure 13F:
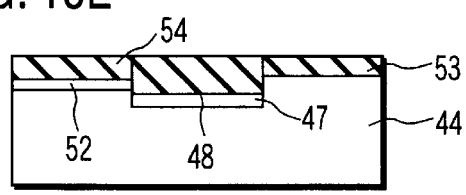

Finally, a thin thermally grown nitride film 53 is formed in the region covered with the thick mask 49, with a thick thermally grown nitride film 48 being formed in the exposed region, as shown in FIG. 13F. Further, a thermally grown nitride film 54 having a thickness intermediate between those of the thermally grown nitride films 48 and 53 is formed in the region covered with the thin mask 50.

It is possible to apply an additional ion implantation treatment after the peeling of the masks in the process step shown in FIG. 13D under the conditions same as those employed in the previous step. The additional ion implantation treatment permits increasing the depth of the amorphous regions, with the result that it is possible to increase the thickness of each of the three thermally grown nitride films 48, 53 and 54.

According to this example, high quality thermally grown nitride films 53, 48 and 54 differing from each other in thickness are formed in the silicon region 44, and in the single crystalline silicon layers 47 and 52, respectively. It is also possible to form a thermally grown nitride film having a thickness larger than that in the ordinary process of applying a thermal nitridation treatment to a silicon substrate.

Further, a plurality of thermally grown nitride films differing from each other in thickness can be formed on a single wafer in a short time by using a plurality of masks differing from each other in thickness. If the particular technique is applied to the manufacture of a semiconductor device, it is possible to obtain an MIS type semiconductor device including a plurality of gate insulating films differing from each other in thickness.

FIGS. 14A to 14F are cross sectional views showing another example of the manufacturing process according to the second method of the present invention.

In the first step, a thick mask 49 and a thin mask 50 are formed in predetermined regions on a surface of the substrate having at least a silicon region 44 formed on the surface, as shown in FIG. 14A. Then, nitrogen ions N$^+$ and oxygen ions O$^+$ are implanted into the silicon region 44 covered with the masks 49 and 50 in a direction perpendicular to the surface of the silicon region 44, as shown in FIG. 14B. This ion implantation step is carried out at an accelerating energy of 10 KeV and a dose of $1 \times 10^{15}$ cm$^{-2}$ for each of the nitrogen ions N$^+$ and oxygen ions O$^+$.

In this step, the implanted ions do not reach that surface of the silicon region 44 which is covered with the thick mask 49, with the result that the particular region of the silicon region 44 remains unchanged, as shown in FIG. 14C. However, an amorphous layer 46 is formed in the exposed region which is not covered with any of these masks 49 and 50. Also, a thin amorphous layer 51 is formed in the surface region, which is covered with the thin mask 50, of the silicon region 44.

After the ion implantation step, the masks 49 and 50 are removed so as to expose the silicon surface region, as shown in FIG. 14D. Then, an RTN treatment is applied to the substrate surface having the amorphous layers 46 and 51 formed therein under a nitrogen gas atmosphere containing ammonia. The annealing temperature in this step is 1100° C. and the annealing time is 240 seconds.

Finally, a thermally grown nitride film 53 is formed in the region covered with the thick mask 49 because the oxygen ion implantation is inhibited by the thick mask 49, as shown in FIG. 14F. On the other hand, a thermally grown oxynitride film 55 is formed in the exposed region. Also, a thermally grown oxynitride film 56 is formed in the region covered with the thin mask 50. The thickness of the thermally grown oxynitride 56 is intermediate between those of the thermally grown nitride film 53 and the thermally grown oxynitride film 55.

According to this example, the interface states is held at a low level in any of the interface between the silicon region 44 and the thermally grown nitride film 53, the interface between the silicon layer 47, which is made single crystalline, and the thermally grown oxynitride film 55, and the interface between the silicon layer 52, which is made single crystalline, and the thermally grown oxynitride film 56. It should also be noted that, since an amorphous silicon layer is selectively formed by implanting the ion species containing oxygen and an RTN treatment is applied to the resultant amorphous silicon layer, it is possible to form selectively a thermally grown oxynitride film.

Further, it is possible to form both a thermally grown nitride film and a thermally grown oxynitride film on a single wafer by a short process by implanting ions with masks formed in predetermined regions. If the particular process of the present invention is applied to the manufacture of a semiconductor device, it is possible to obtain an MIS type semiconductor device including gate insulating films made of a thermally grown nitride film and a thermally grown oxynitride film.

FIGS. 15A to 15E are cross sectional views showing another example of the manufacturing process according to the second method of the present invention.

In the first step, an RTN treatment is applied to a substrate having at least a silicon region 44 formed on the surface under a nitrogen gas atmosphere containing ammonia so as to form a thermally grown nitride film 45 on the surface of the silicon region 44, as shown in FIG. 15A. The annealing temperature is set at 1100° C. and the annealing treatment is carried out for 240 seconds.

In the next step, nitrogen ions N$^+$ are implanted into the thermally grown nitride film 45 in a direction perpendicular to the surface of the silicon region 44, as shown in FIG. 15B. The ion implantation is carried out under an accelerating energy of 10 KeV and a dose of $1 \times 10^{15}$ cm$^{-2}$. After the nitrogen ion implantation, the thermally grown nitride film 45 is converted into a nitride film 57 containing a large amount of dangling bond, as shown in FIG. 15C. Also, an amorphous silicon layer 46 is formed right under the thermally grown nitride film 57.

In the next step, an RTN treatment is applied under a nitrogen gas atmosphere containing ammonia, as shown in FIG. 15D. In this step, the annealing temperature is set at 1100° C. and the annealing treatment is carried out for 240 seconds. Finally, the thermally grown nitride film 57 containing a large amount of dangling bond is converted into a high quality thermally grown nitride film 58, as shown in FIG. 15E. Also, the amorphous silicon layer 46 is converted into any of a thermally grown nitride film 48 or a single crystalline silicon layer 47.

According to the example described above, the interface states is held at a low level at the interface between the single crystalline silicon layer 47, which is converted from the amorphous silicon layer, and the thermally grown nitride film 48. Also, the thermally grown nitride film 57 and the amorphous silicon layer 46, both facilitating the diffusion of silicon atoms, are formed by ion implantation into the thermally grown nitride film 45, followed by applying a thermal nitridation treatment to these thermally grown nitride film 57 and the amorphous silicon layer 46. As a result, it is possible to form a thermally grown nitride film thicker than the thermally grown nitride film formed in the initial step.

FIGS. 16A to 16E are cross sectional views showing another example of the manufacturing process according to the second method of the present invention.

Figure 16A:
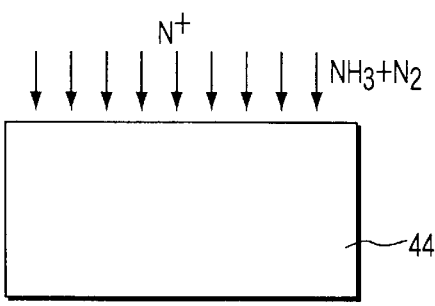
FIGS. 16A to 16E are cross sectional views showing another example of the manufacturing process according to the second method of the present invention.
Figure 16B:
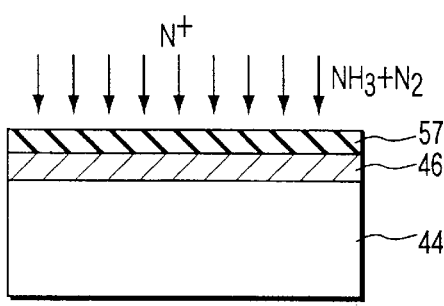

In the first step, nitrogen ions N$^+$ are implanted into a substrate having at least a silicon region 44 formed on a surface in a direction perpendicular to the surface of the silicon region 44, as shown in FIG. 16A. During the ion implantation step, an RTN treatment is applied under a nitrogen gas atmosphere containing ammonia. The nitrogen ion implantation is carried out at a dose of $1 \times 10^{15}$ cm$^{-2}$, and the annealing temperature is 1100° C. Since the RTN treatment is carried out simultaneously with the ion implantation treatment, a thermally grown nitride film 57 containing a large amount of dangling bond is formed while increasing the thickness of the thermally grown nitride film 57 and, at the same time, an amorphous silicon layer 46 is formed, as shown in FIG. 16B.

Figure 16C:
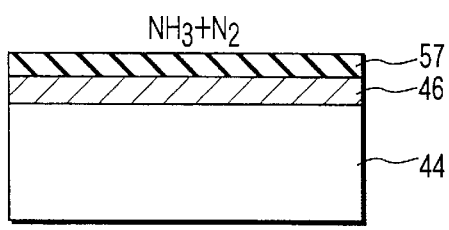
Figure 16D:
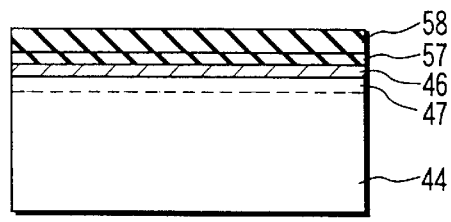
Figure 16E:
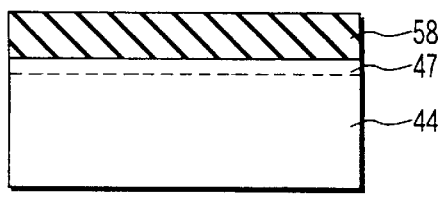

In the next step, the ion implantation is stopped while continuing the RTN treatment, as shown in FIG. 16C. As a result, a thermally grown nitride film 58 with a decreased amount of dangling bond and a single crystalline silicon layer 47 are allowed to grow with progress of the RTN treatment, as shown in FIG. 16D. Finally, the amorphous silicon layer 46 is converted into a single crystalline silicon layer 47, as shown in FIG. 16E. On the other hand, the thermally grown nitride film 57 having a large amount of dangling bond is converted into a high quality thermally grown nitride film 58.

According to the example described above, the interface states is held at a low level at the interface between the single crystalline silicon layer 47 and the thermally grown nitride film 58. Also, since the RTN treatment is carried out while performing an ion implantation treatment, it is possible to prevent a network formation of the thermally grown nitride film and to prevent the single crystallization of the amorphous silicon layer. It follows that silicon and nitrogen are diffused easily, making it possible to obtain a thick thermally grown nitride film.

Incidentally, the same effect can be obtained in the case of alternately carrying out the ion implantation and RTN treatment.

The method shown in FIGS. 16A to 16E can be modified as follows. Specifically, a mask is formed on the surface of the silicon region 44 shown in FIG. 16A, followed by performing the treatments equal to those shown in FIGS. 16B to 16E. Then, the mask is removed and a thermal nitridation treatment is performed. The mask may be formed of amorphous silicon, and the mask can be peeled off with KOH. As a result, a plurality of thermally grown nitride films differing from each other in thickness can be formed on a single substrate. Alternatively, the treatments equal to those shown in FIGS. 16B to 16E are carried out with a mask formed on the surface of the silicon region 44, followed by peeling off the mask and subsequently carrying out again the treatments equal to those shown in FIGS. 16B to 16E. A plurality of thermally grown nitride films differing from each other in thickness can also be formed in this case on a single substrate.

Incidentally, it is possible to form a thermally grown oxynitride film in place of the thermally grown nitride film by applying a thermal oxynitridation treatment. In this case, a plurality of thermally grown oxynitride films differing from each other in thickness can be formed a single substrate. Also, it is possible to form these thermally grown oxynitride films in a short time.

Figure 17A:
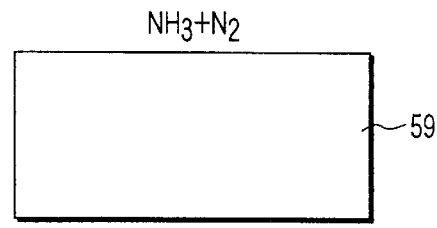
FIGS. 17A and 17B are cross sectional views showing another example of the manufacturing process according to the second method of the present invention.
Figure 17B:
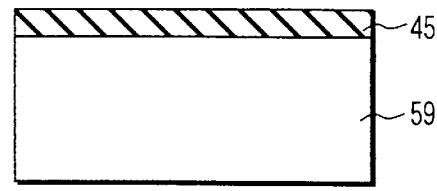

FIGS. 17A and 17B are cross sectional views showing another example of the manufacturing process according to the second method of the present invention.

In the first step, an RTN treatment is applied to a surface region of a silicon wafer 59 having a plane orientation (111) under a nitrogen gas atmosphere containing ammonia, as shown in FIG. 17A. The annealing temperature is set at 1100° C. and the annealing time is 240 seconds. As a result, a thermally grown nitride film 45 is formed on the surface of the silicon wafer 59 having a plane orientation (111), as shown in FIG. 17B.

Since a silicon wafer having a plane orientation (111) is used in this example, the diffusion source of silicon is increased, with the result that it is possible to obtain a thermally grown nitride film thicker than that in the case of forming a thermally grown nitride film on an ordinary wafer having a plane orientation (100). Further, since a silicon wafer having a plane orientation (111) is easier to obtain a smooth surface than a silicon wafer having a plane orientation (100), it is possible to obtain an MIS structure having a uniform film thickness. Incidentally, it is possible to apply a thermal oxynitridation treatment to the silicon wafer to form a thermally grown silicon oxynitride film in place of the thermally grown silicon nitride film.

Figure 18A:
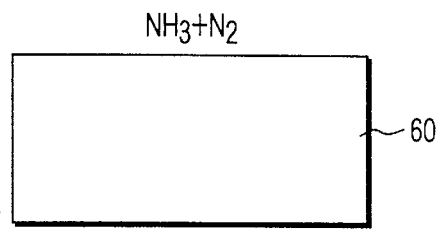
FIGS. 18A and 18B are cross sectional views showing another example of the manufacturing process according to the second method of the present invention.
Figure 18B:
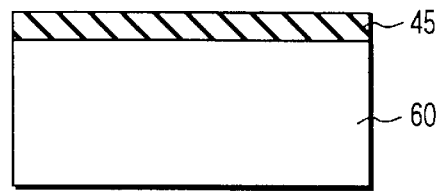

FIGS. 18A and 18B are cross sectional views showing another example of the manufacturing process according to the second method of the present invention.

In the first step, an RTN treatment is applied to a surface region of a silicon wafer 60, said surface region being deviant in angle from the (100) main plane orientation, i.e., a so-called "off substrate", under a nitrogen gas atmosphere containing ammonia, as shown in FIG. 18A. The annealing temperature is set at 1100° C., and the annealing time is 240 seconds. As a result, a thermally grown nitride film 45 is formed on the surface of the off-substrate 60, as shown in FIG. 18B.

According to this example, used is a silicon wafer deviant in angle from the main plane orientation, making it possible to increase the silicon diffusion source. As a result, it is possible to form a thermally grown nitride film thicker than that in the case of applying a thermal nitridation treatment to an ordinary wafer having (100) main plane orientation.

Figure 19A:
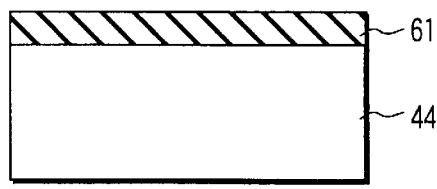
FIGS. 19A to 19C are cross sectional views showing another example of the manufacturing process according to the second method of the present invention.
Figure 19B:
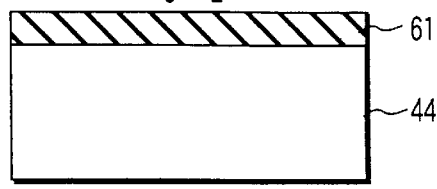
Figure 19C:
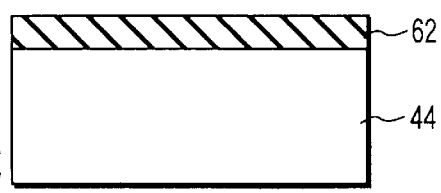

FIGS. 19A to 19C are cross sectional views showing another example of the manufacturing process according to the second method of the present invention.

In the first step, a nitride film 61 is deposited by an ordinary CVD method on a silicon region 44 of a substrate having at least the silicon region 44 formed on the surface, as shown in FIG. 19A, followed by applying an RTN treatment to the CVD nitride film 61 under a nitrogen gas atmosphere containing ammonia. The annealing temperature is set at 1100° C. and the annealing time is 240 seconds. After the annealing treatment, a thermally grown nitride film 62 is formed on a surface of the silicon region 44, as shown in FIG. 19C.

In this example, the nitride film 61 is deposited first on a silicon substrate by a CVD method, followed by applying an RTN treatment to the nitride film. As a result, an dangling bond within the nitride film is terminated, making it possible to obtain a thermally grown nitride film 62 of a high quality like a thermally grown nitride film. It should also be noted that the interface states between the silicon region 44 and the thermally grown nitride film 62 is held at a low level. Further, since the nitride film 61 is formed by a CVD method, it is possible to obtain a nitride film thicker than the thermally grown nitride film obtained by the ordinary method.

Further, FIGS. 20A to 20D are cross sectional views showing still another example of the manufacturing process according to the second method of the present invention.

Figure 20A:
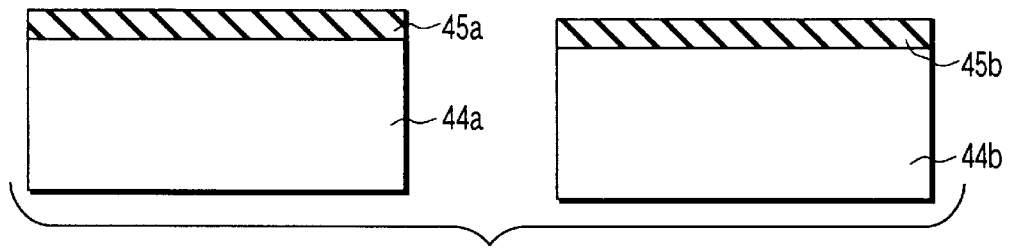
FIGS. 20A to 20D are cross sectional views showing still another example of the manufacturing process according to the second method of the present invention.

In the first step, prepared are two substrates 44a, 44b each having at least a silicon region formed on a surface, as shown FIG. 20A. Then, an RTN treatment is applied to the surface of the silicon region of each of these substrate 44a, 44b under a nitrogen gas atmosphere containing ammonia so as to form thermally grown nitride films 45a, 45b. The annealing temperature is set at 1100° C. and the annealing time is 240 seconds.

Figure 20B:
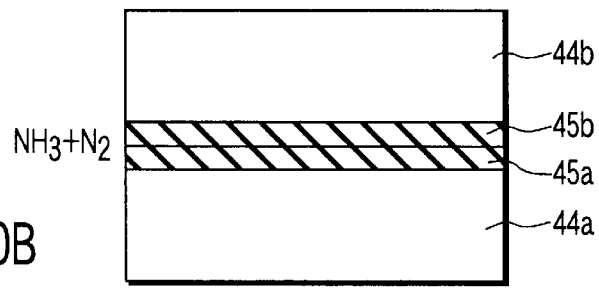
Figure 20C:
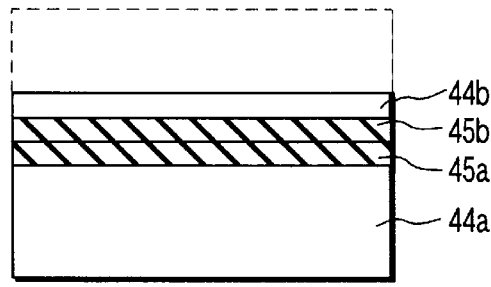
Figure 20D:
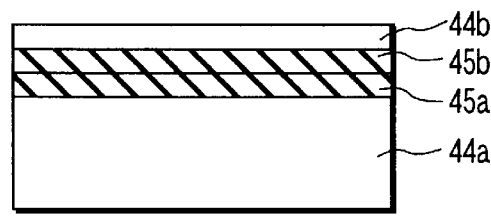

In the next step, the two thermally grown nitride films 45a and 45b are brought into mutual contact, followed by applying an additional RTN treatment so as to bond the two substrates 44a, 44b, as shown in FIG. 20B. Then, the substrate 44b is etched, as shown FIG. 20C so as to prepare a structure shown in FIG. 20D, said structure including a silicon region having a thickness of 200 nm.

In the example described above, the high quality thermally grown nitride films 45a, 45b are bonded to each other to form a thermally grown nitride film having a sufficiently large thickness. Also, since the thermally grown nitride films are bonded to each other by means of an RTN treatment, it is possible to suppress the defect at the interface between the two thermally grown nitride films.

It is possible to carry out the steps shown in FIGS. 20A and 20B simultaneously under the same gaseous atmosphere. It is also possible to use as a gate electrode the silicon layer left unremoved after the etching step.

Let us describe another example of the manufacturing process according to the second method of the present invention with reference to FIGS. 12A to 12E.

In the first step, the substrate having at least a silicon region 44 formed on a surface is held at a temperature of −190° C., as shown in FIG. 12A. Under this condition, nitrogen ions $N^+$ are implanted into the silicon region 44 in a direction perpendicular to the surface of the silicon region 44 under an accelerating energy of 10 KeV and a dose of $1 \times 10^{15}$ cm$^{-2}$, so as to form an amorphous layer 46 consisting essentially of silicon in a surface region of the silicon region 44, as shown in FIG. 12B. Further, an RTN treatment is applied to the amorphous layer 46 under a nitrogen gas atmosphere containing ammonia, as shown in FIG. 12C. The annealing temperature is set at 1100° C. and the annealing time is 240 seconds.

As described previously, the amorphous layer 46 is finally converted by the thermal nitridation treatment into a thermally grown nitride film 48 or a single crystalline silicon layer 47, as shown in FIG. 12E.

In the example described above, the substrate temperature is set at such a low temperature as −190° C. in the ion implantation step, making it possible to convert a larger region of the silicon region 44 into an amorphous region, compared with the ion implantation carried out at room temperature. Therefore, in the case of forming an amorphous region sized equal to that formed in a substrate held at room temperature, the ion implantation carried out at such a low temperature as −190° C. makes it possible to diminish the amount of dose of the nitrogen ions. It is also possible to decrease the accelerating energy. In other words, if the ion implantation is carried out at a dose and an accelerating energy equal to those in the case of carrying out the ion implantation at room temperature, the method described above makes it possible to obtain a thermally grown nitride film of a larger thickness.

It should also be noted that the ion implantation carried out at a very low temperature makes it possible to suppress the interface states at a low level at the interface between the single crystalline silicon layer 47 and the thermally grown nitride film 48. Further, since an RTN treatment is applied to the silicon region which has been made amorphous by the ion implantation, it is possible to obtain a thermally grown nitride film thicker than that in the case of applying a nitridation treatment to the silicon substrate.

Incidentally, the method of forming a thick thermally grown nitride film by setting the silicon substrate temperature at such a low level as −190° C. can also be employed in the process shown in FIGS. 13A to 13F and in the process shown in FIGS. 14A to 14F. Further, a thermal oxynitridation treatment can be applied in place of the thermal nitridation treatment.

The second method of the present invention described above can be worked in various modified fashions. For example, preferable annealing temperature in the RTN step for the thermal nitridation is 900° C. or more. Preferable annealing time in the RTN step is 60 seconds or more. It is also possible to form a thermally grown nitride film by using gases other than an ammonia gas. Further, it is possible to use a thermally grown oxynitride film formed by a thermal oxynitridation treatment or a thermally grown oxide film in place of the thermally grown nitride film. In the case of forming a thermally grown oxynitride film, oxygen ions are implanted together with nitrogen ions into the silicon region.

Figure 21:
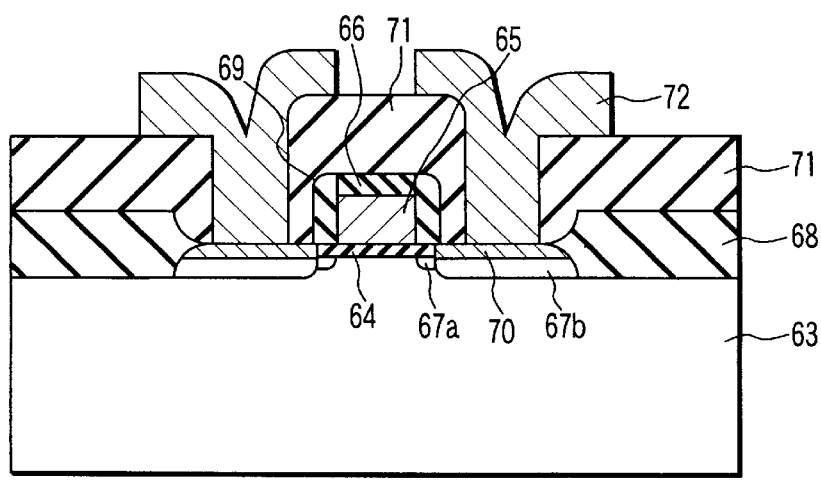
FIG. 21 is a cross sectional view showing another example of an MIS transistor manufactured by the process according to the second method of the present invention.

FIG. 21 is a cross sectional view exemplifying an n-channel MIS transistor including a gate insulating film consisting of a thermally grown nitride film or a thermally grown oxynitride film formed by the method of the present invention. As shown in the drawing, thermal silicon oxide films 68 each acting as an element isolating film is formed within a silicon region, i.e., a p-type silicon substrate 63. N-type source-drain diffused layers 67a are formed by phosphorus implantation within the region sandwiched between the two thermal silicon oxide films 68. Incidentally, the source-drain diffused layer includes an LDD (lightly doped drain) region 67a, and a silicide layer 70 is formed on the diffused layer 67a. Formed on the channel region is a laminate structure consisting of a gate insulating film 64, a gate electrode 65 made of polycrystalline silicon, and a CVD silicon oxide film 66. Further, the side surface of the laminate structure is covered with a silicon nitride film 69, and the resultant structure is covered with a CVD oxide film 71. Still further, an aluminum wiring 72 is connected to the silicide layer 70 via a contact hole made through the CVD oxide film. It should be noted that the gate insulating film 64 consists of a thermally grown nitride film or a thermally grown oxynitride film formed by the method of the present invention.

As described above, the present invention provides a method of manufacturing a semiconductor device which permits forming a high quality silicon nitride film having a sufficiently large thickness. The thermally grown nitride film (or thermally grown oxynitride film) formed by the method of the present invention can be applied not only to the formation of a gate insulating film of an MIS transistor, but also to the formation of a gate insulating film or an insulating film between gate electrodes included in a non-volatile memory device. Further, the technical idea of the present invention can be applied to the formation of an insulating film included in a capacitor, leading to a high industrial value of the present invention.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising the step of forming a nitride film containing a network terminal element on a semiconductor substrate by nitriding said semiconductor substrate in the presence of said network terminal element.

2. The method of manufacturing a semiconductor device according to claim 1, wherein said nitride film is a thermally grown nitride film and said step of applying a nitridation treatment to the semiconductor substrate in the presence of said network terminal element comprises introducing an element for terminating an unbounded species, which is generated by cutting a part of the network of a nitride film, followed by applying a thermal nitridation treatment to the semiconductor substrate having said network terminal element introduced therein.

3. The method of manufacturing a semiconductor device according to claim 2, wherein said network terminal element consists of a halogen element.

4. The method of manufacturing a semiconductor device according to claim 3, wherein said network terminal element consists of fluorine.

5. The method of manufacturing a semiconductor device according to claim 2, wherein the concentration of the network terminal element in said thermally grown nitride film falls within a range of between $10^{11}$ atoms/cm$^2$ and $10^{15}$ atoms/cm$^2$.

6. The method of manufacturing a semiconductor device according to claim 2, wherein said network terminal element is introduced into the semiconductor substrate by means of ion implantation.

7. The method of manufacturing a semiconductor device according to claim 6, further comprising the steps of:

forming a film for adjusting a peak of concentration on a substrate before introduction of said network terminal element; and peeling off said peak concentration adjusting film after introduction of the network terminal element.

8. The method of manufacturing a semiconductor device according to claim 2, wherein said network terminal element is introduced into the semiconductor substrate by means of solid phase diffusion.

9. The method of manufacturing a semiconductor device according to claim 2, wherein introduction of the network terminal element into the semiconductor substrate is carried out by forming a nitride film containing a network terminal element on the semiconductor substrate.

10. The method of manufacturing a semiconductor device according to claim 2, wherein introduction of the network terminal element is carried out by supplying a gaseous material containing a network terminal element and a gaseous material containing nitrogen simultaneously or alternately onto said semiconductor substrate.

11. A method of manufacturing a semiconductor device, comprising the steps of:

forming an amorphous silicon layer on a silicon substrate; and forming a thermally grown nitride film or a thermally grown oxynitride film by subjecting said substrate having said amorphous silicon layer formed thereon to a thermal nitridation treatment or a thermal oxynitridation treatment.

12. The method of manufacturing a semiconductor device according to claim 11, wherein said amorphous silicon layer is formed by deposition on said silicon substrate.

13. The method of manufacturing a semiconductor device according to claim 12, further comprising the step of forming a thermally grown nitride film or a thermally grown oxynitride film on said silicon substrate before deposition of said amorphous silicon layer on the silicon substrate.

14. The method of manufacturing a semiconductor device according to claim 11, wherein said amorphous silicon layer is formed by implanting predetermined ions into said silicon substrate.

15. The method of manufacturing a semiconductor device according to claim 14, wherein said ions are at least one kind selected from the group consisting of $N^+$, $Si^+$, $H^+$, $D^+$ and inert gas.

16. The method of manufacturing a semiconductor device according to claim 15, wherein $O^+$ are supplied simultaneously.

17. The method of manufacturing a semiconductor device according to claim 14, further comprising the step of forming a thermally grown nitride film or a thermally grown oxynitride film on said silicon substrate before implantation of said ions into the silicon substrate.

18. The method of manufacturing a semiconductor device according to claim 14, wherein said thermal nitridation treatment or thermal oxynitridation treatment is carried out simultaneously or alternately with the ion implantation step.

19. The method of manufacturing a semiconductor device according to claim 14, wherein said ion implantation is carried out by cooling said silicon substrate.

20. The method of manufacturing a semiconductor device according to claim 14, further comprising the steps of:

forming a mask on a predetermined region of the silicon substrate before implantation of said predetermined ions into the silicon substrate; and peeling off said mask after implantation of said ions into the silicon substrate.

* * * * *